(12) United States Patent
Zamir et al.

(10) Patent No.: US 11,822,820 B2
(45) Date of Patent: Nov. 21, 2023

(54) STORAGE SYSTEM AND METHOD FOR MULTI-CELL MAPPING

(71) Applicant: Western Digital Technologies, Inc., San Jose, CA (US)

(72) Inventors: Ran Zamir, Ramat Gan (IL); Eran Sharon, Rishon Lezion (IL); Idan Alrod, Herzeliya (IL)

(73) Assignee: Western Digital Technologies, Inc., San Jose, CA (US)

( * ) Notice: Subject to any disclaimer, the term of this patent is extended or adjusted under 35 U.S.C. 154(b) by 223 days.

(21) Appl. No.: 17/523,124

(22) Filed: Nov. 10, 2021

(65) Prior Publication Data

US 2023/0146046 A1 May 11, 2023

(51) Int. Cl.
| | | |
|---|---|---|
| *G11C 11/56* | (2006.01) | |
| *G06F 3/06* | (2006.01) | |
| *H04L 27/36* | (2006.01) | |
| *G06F 13/16* | (2006.01) | |

(52) U.S. Cl.
CPC .......... *G06F 3/0659* (2013.01); *G06F 3/0604* (2013.01); *G06F 3/0679* (2013.01); *G06F 13/1668* (2013.01); *G11C 11/5621* (2013.01); *G11C 11/5628* (2013.01); *H04L 27/36* (2013.01); *G11C 2211/562* (2013.01)

(58) Field of Classification Search
CPC ....................... G11C 11/5628; G11C 2211/562
USPC .................................................. 365/185.03
See application file for complete search history.

(56) References Cited

U.S. PATENT DOCUMENTS

| | | |
|---|---|---|
| 11,138,065 B1 | 10/2021 | Zamir et al. |
| 2004/0080979 A1 | 4/2004 | Park |
| 2010/0110788 A1* | 5/2010 | Bauer ..................... G11C 16/06 365/189.05 |
| 2013/0094298 A1 | 4/2013 | Vigoda et al. |
| 2014/0347924 A1 | 11/2014 | Kasorla et al. |
| 2020/0105340 A1* | 4/2020 | Yabe ................... G11C 11/5628 |

FOREIGN PATENT DOCUMENTS

| | | |
|---|---|---|
| JP | 2009524152 A | 6/2009 |
| JP | 2009529203 A | 8/2009 |
| JP | 2015521439 A | 7/2015 |

* cited by examiner

*Primary Examiner* — Anthan Tran
(74) *Attorney, Agent, or Firm* — Crowell & Moring LLP

(57) ABSTRACT

A storage system has a memory with memory cells that can store a non-power-of-two number of states. A map is used to distribute data bits in the memory. The map can be a modified version of a quadrature amplitude modulation (QAM) map. The mapping can be done by a controller in the storage system or by the memory die. Performing the mapping in the memory die can reduce data traffic between the controller and the memory die, which can provide an improvement to performance and power consumption.

14 Claims, 10 Drawing Sheets

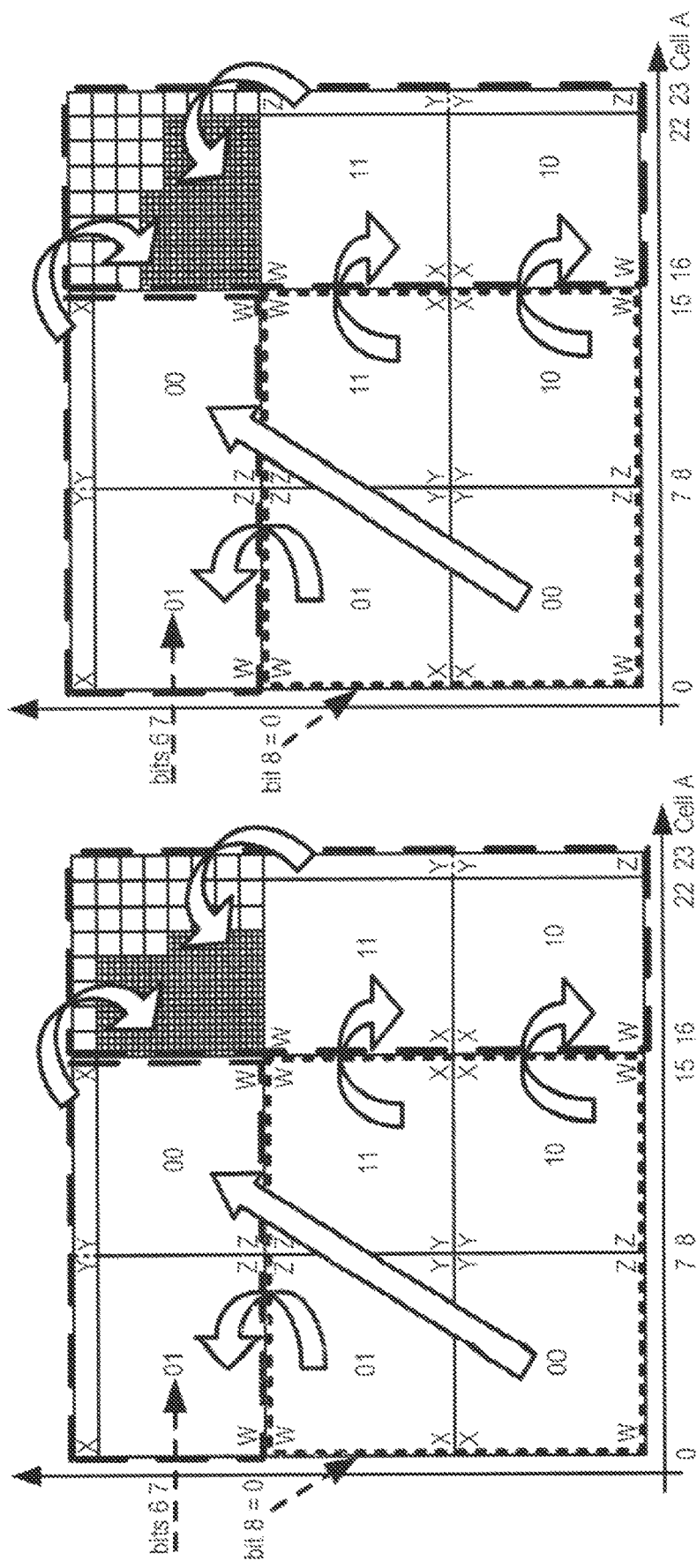

STORAGE SYSTEM AND METHOD FOR MULTI-CELL MAPPING

BACKGROUND

With more and more digital data generated in life, there is a need to increase the storage capacity of a memory in a storage system. One way to increase storage capacity is by increasing the number of physical memory cells per a given area on a memory die ("physical scaling"). Another way is to increase the number of states or levels that can be stored in a memory cell ("logical scaling"). The process of logical scaling to increase the total number of information bits per memory cell can be done in conjunction with physical scaling.

BRIEF DESCRIPTION OF THE DRAWINGS

FIGS. 8A and 8B are diagrams of a modified QAM map of an embodiment for alternating state shaping.

DETAILED DESCRIPTION

The following embodiments generally relate to a storage system and method for multi-cell mapping. In one embodiment, a storage system is presented comprising a memory die and a controller configured to provide data to the memory die for storage. The memory die comprises a plurality of memory cells, each memory cell configured to store a non-power-of-two number of states. The memory die is further configured to determine where to store the data in the plurality of memory cells using a non-power-of-two map; and write the data into the plurality of memory cells as determined by the map. In another embodiment, a method is provided comprising receiving a plurality of data bits to be stored in the memory die; mapping the plurality of data bits to the plurality of memory cells using a non-power-of-two map; and storing the plurality of data bits in the plurality of memory cells in the memory die according to the mapping. In yet another embodiment, a storage system is provided comprising a memory die comprising a plurality of memory cells, each memory cell configured to store a non-power-of-two number of states, and means for mapping a plurality of data bits to the plurality of memory cells using a non-power-of-two map. Other embodiments are provided and can be used alone or in combination.

Figure 1A:
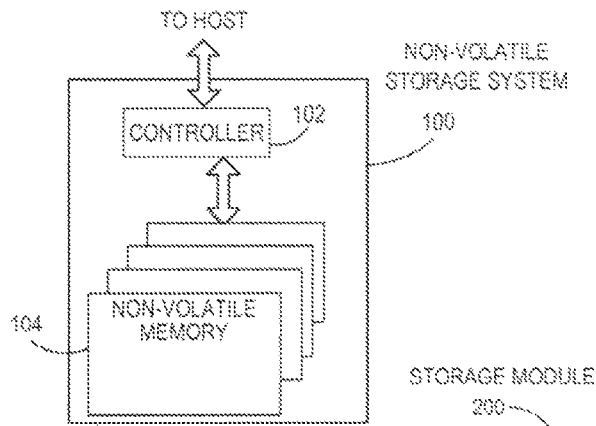
FIG. 1A is a block diagram of a non-volatile storage system of an embodiment.
Figure 1B:
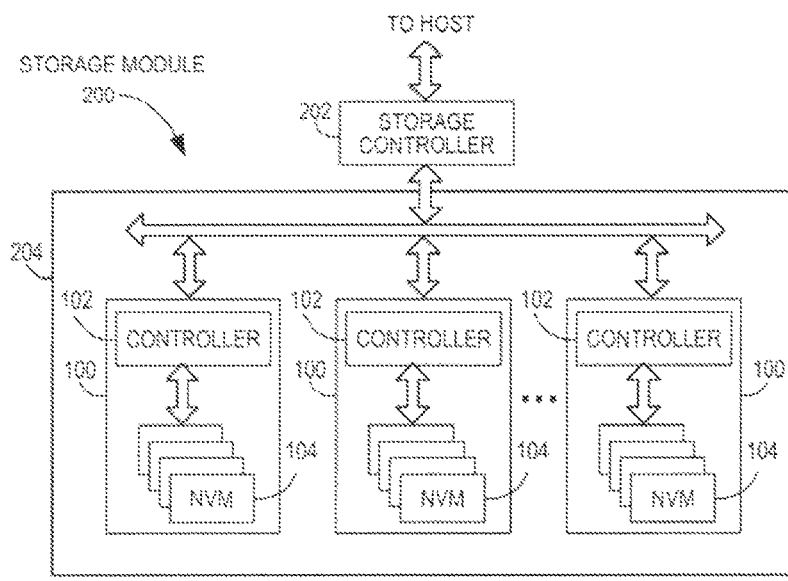
FIG. 1B is a block diagram illustrating a storage module of an embodiment.
Figure 1C:
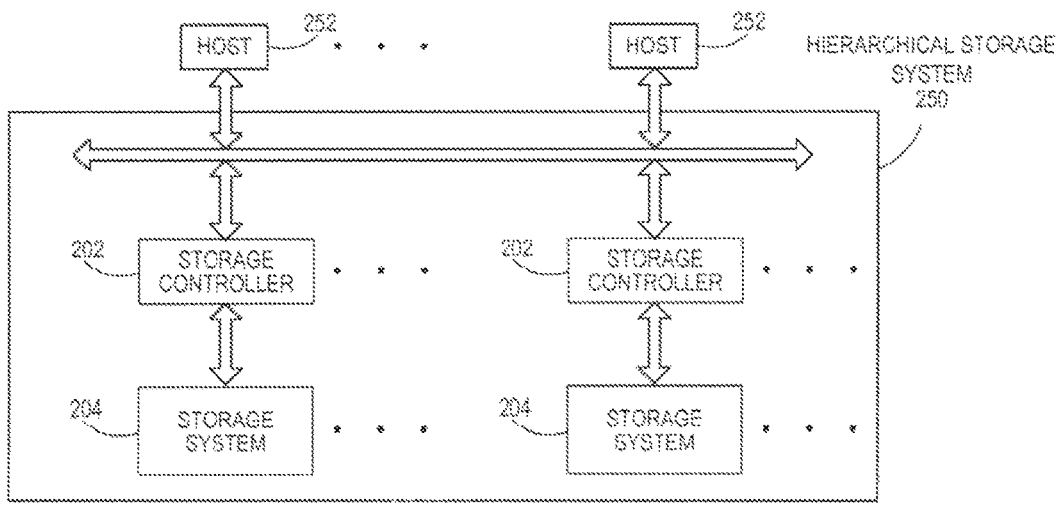
FIG. 1C is a block diagram illustrating a hierarchical storage system of an embodiment.

Turning now to the drawings, storage systems suitable for use in implementing aspects of these embodiments are shown in FIGS. 1A-1C. FIG. 1A is a block diagram illustrating a non-volatile storage system 100 (sometimes referred to herein as a storage device or just device) according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a non-volatile memory controller (e.g., a flash, resistive random-access memory (ReRAM), phase-change memory (PCM), or magneto-resistive random-access memory (MRAM) controller)) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a non-volatile memory controller is a device that manages data stored on non-volatile memory and communicates with a host, such as a computer or electronic device. A non-volatile memory controller can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. (Alternatively, the host can provide the physical address.) The non-volatile memory controller can also perform various memory management functions, such as, but not limited to, wear leveling (distributing writes to avoid wearing out specific blocks of memory cells that would otherwise be repeatedly written to) and garbage collection (after a block is full, moving only the valid pages of data to a new block, so the full block can be erased and reused). Also, the structure for the "means" recited in the claims can include, for example, some or all of the structures of the controller described herein, programmed or manufactured as appropriate to cause the controller to operate to perform the recited functions.

Non-volatile memory die 104 may include any suitable non-volatile storage medium, including ReRAM, MRAM, PCM, NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), quad-level cell (QLC) or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card-based system, such as a secure digital (SD) or a micro secure digital (micro-SD) card (or USB, SSD, etc.). In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some storage system architectures (such as the ones shown in FIGS. 1B and 1C), 2, 4, 8 or more memory channels may exist between the controller and the memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA), peripheral component interconnect express (PCIe) interface, or double-data-rate (DDR) interface. Storage module 200, in one embodiment, may be a solid-state drive (SSD), or non-volatile dual in-line memory module (NVDIMM), such as found in server PC or portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be a Non-Volatile Memory Express (NVMe) or fiber channel over Ethernet (fCoE) interface. In one embodiment, the system illustrated in FIG. 1C may be a rack mountable mass storage system that is accessible by multiple host computers, such as would be found in a data center or other location where mass storage is needed.

Figure 2A:
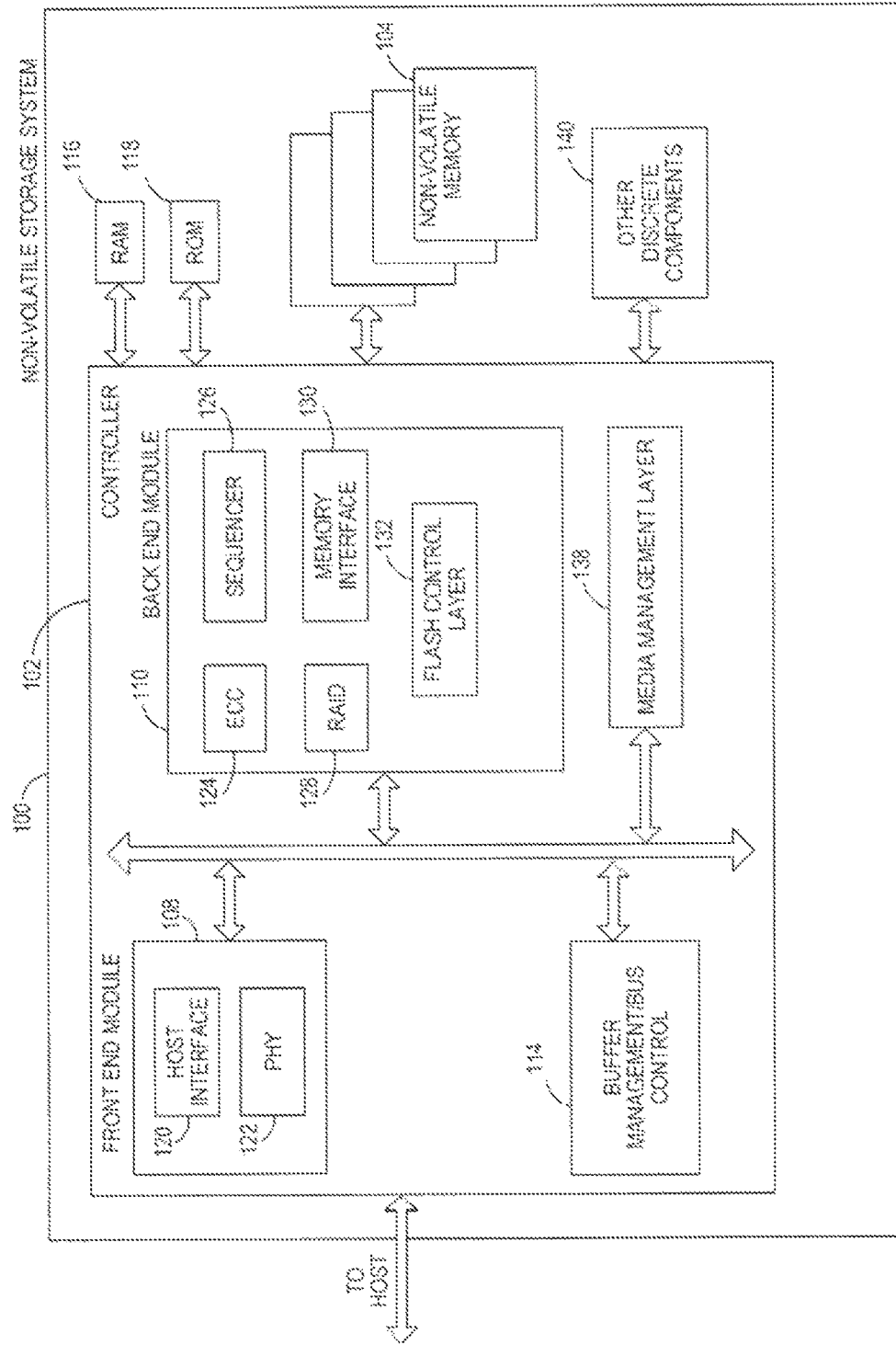
FIG. 2A is a block diagram illustrating components of the controller of the non-volatile storage system illustrated in FIG. 1A according to an embodiment.

FIG. 2A is a block diagram illustrating components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. The controller 102 may sometimes be referred to herein as a NAND controller or a flash controller, but it should be understood that the controller 102 can be used with any suitable memory technology, example of some of which are provided below.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, serially attached small computer system interface (SAS), Fibre Channel, universal serial bus (USB), PCIe, and NVMe. The host interface 120 typically facilitates transfer for data, control signals, and timing signals.

Back end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
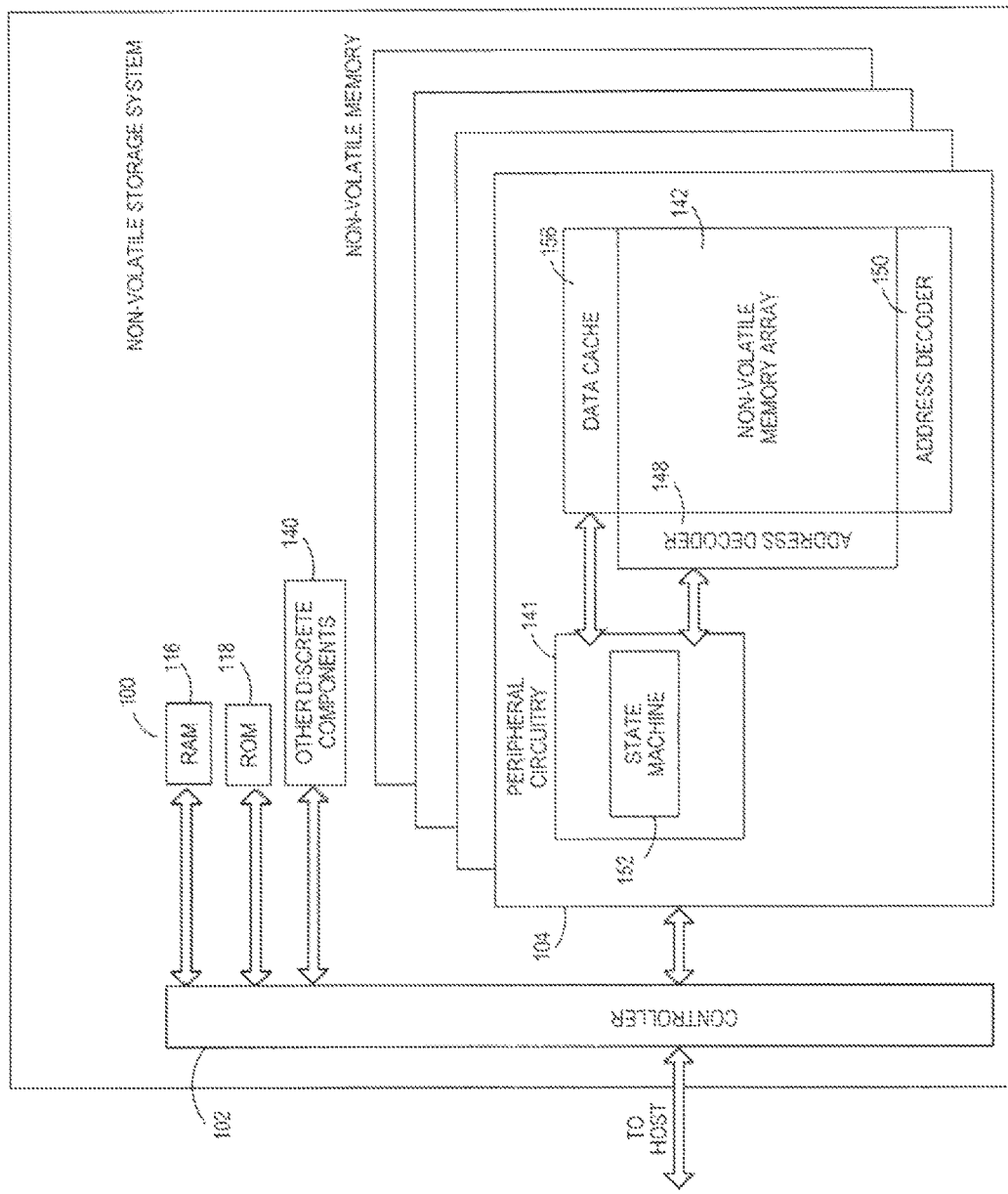
FIG. 2B is a block diagram illustrating components of the non-volatile storage system illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two dimensional and/or three dimensional configuration. Non-volatile memory die 104 further includes a data cache 156 that caches data. Peripheral circuitry 141 includes a state machine 152 that provides status information to the controller 102.

Returning again to FIG. 2A, the flash control layer 132 (which will be referred to herein as the flash translation layer (FTL) or, more generally, the "media management layer," as the memory may not be flash) handles flash errors and interfaces with the host. In particular, the FTL, which may be an algorithm in firmware, is responsible for the internals of memory management and translates writes from the host into writes to the memory 104. The FTL may be needed because the memory 104 may have limited endurance, may only be written in multiples of pages, and/or may not be written unless it is erased as a block of memory cells. The FTL understands these potential limitations of the memory 104, which may not be visible to the host. Accordingly, the FTL attempts to translate the writes from host into writes into the memory 104.

The FTL may include a logical-to-physical address (L2P) map (sometimes referred to herein as a table or data structure) and allotted cache memory. In this way, the FTL, translates logical block addresses ("LBAs") from the host to physical addresses in the memory 104. The FTL can include other features, such as, but not limited to, power-off recovery (so that the data structures of the FTL can be recovered in the event of a sudden power loss) and wear leveling (so that the wear across memory blocks is even to prevent certain blocks from excessive wear, which would result in a greater chance of failure).

Figure 3:
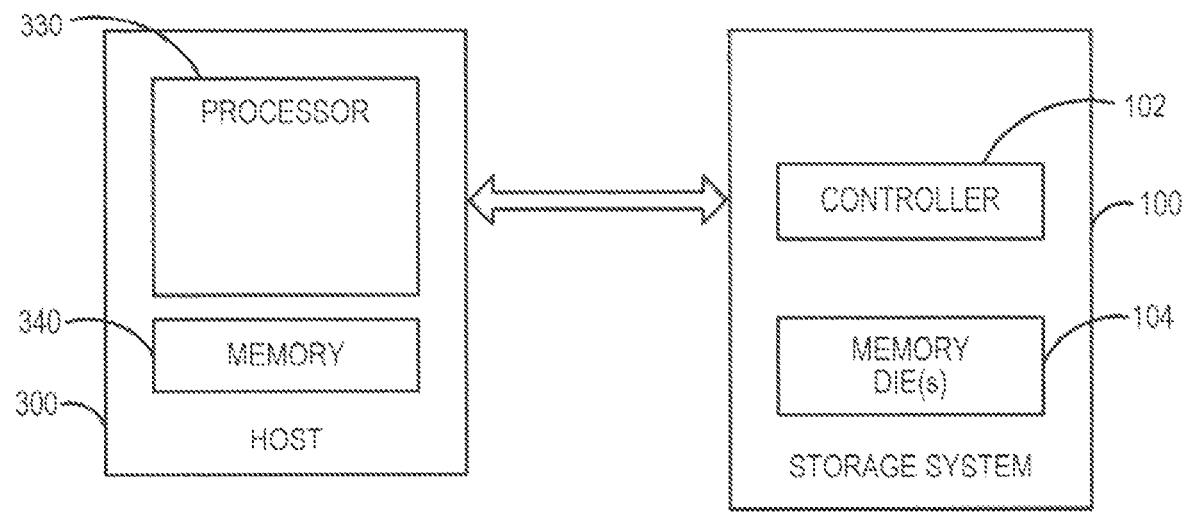
FIG. 3 is a block diagram of a host and a storage system of an embodiment.

Turning again to the drawings, FIG. 3 is a block diagram of a host 300 and storage system (sometimes referred to herein as a device) 100 of an embodiment. The host 300 can take any suitable form, including, but not limited to, a computer, a mobile phone, a digital camera, a tablet, a wearable device, a digital video recorder, a surveillance system, etc. The host 300 comprises a processor 330 that is configured to send data (e.g., initially stored in the host's memory 340 (e.g., DRAM)) to the storage system 100 for storage in the storage system's memory 104 (e.g., non-volatile memory dies). While the host 300 and the storage system 100 are shown as separate boxes in FIG. 3, it should be noted that the storage system 100 can be integrated in the host 300, the storage system 100 can be removably connected to the host 300, and the storage system 100 and host 300 can communicate over a network. It should also be noted that the memory 104 can be integrated in the storage system 100 or removably connected to the storage system 100.

As discussed above, with more and more digital data generated in life, there is a need to increase the storage capacity of a memory in a storage system. One way to increase storage capacity is by increasing the number of physical memory cells per a given area on a memory die ("physical scaling"). Another way is to increase the number of states or levels that can be stored in a memory cell ("logical scaling"). The process of logical scaling to increase the total number of information bits per memory cell can be done in conjunction with physical scaling.

Figure 4:
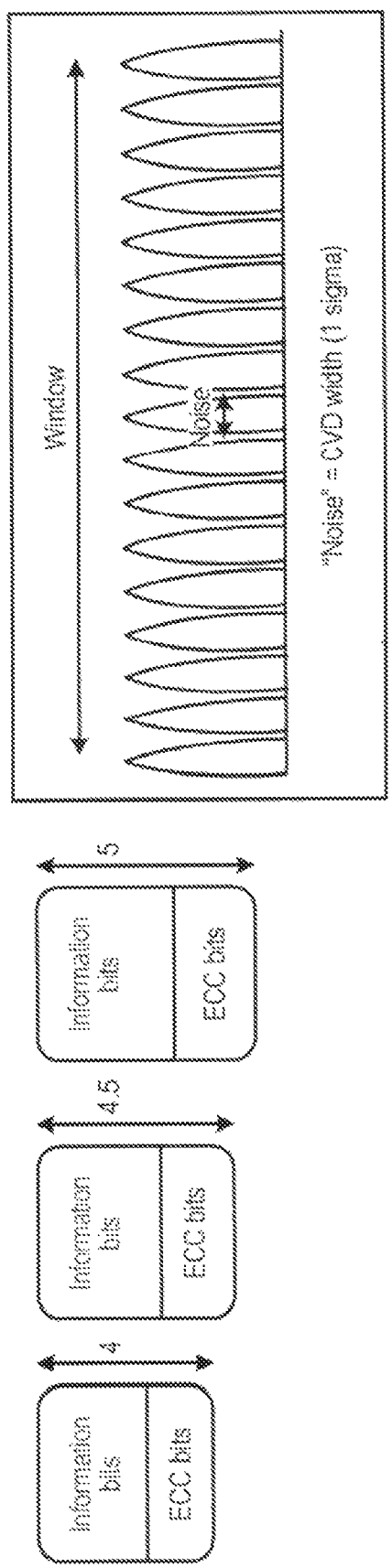
FIG. 4 is an illustration of an embodiment showing examples of bits per cell and a window-to-noise ratio.

Current X4 memories use four physical bits per cell with 16 voltage levels and achieve less than four information bits/cell considering the additional bits used for error correction code (ECC) parity. However, from an information theory perspective, given the achievable window-to-noise ratio (W/N) of a memory die, it is possible to get a higher logical density of between four and five information bits/cell, which will require more than four physical bits per cell. This is shown in FIG. 4.

One approach to increase logical scaling is to provide an X5 memory with five physical bits per cell and 32 voltage levels. However, with 32 levels, programming speed may be significantly reduced, and the amount of traffic to the memory die may be much higher, reducing performance and increasing power consumption. A better approach may be to use X4.5 with 23 voltage levels, which amounts to 4.52 physical bits per cell. However, mapping the programmed data into 23 voltage levels presents a new challenge.

The following embodiments can be used to map data into adjacent (or non-adjacent) memory cells with a non-power-of-two number of voltage levels. The following examples use 23 as the non-power-of-two number, but it should be understood that this is merely an example, and other non-power-of-two numbers can be used. As will be discussed in more detail below, these embodiments enable support for a non-power-of-two number of states that keep the mapper/de-mapper simple and easy to implement while also maintaining ECC properties of minimizing logical errors for any physical error. Additionally, these embodiments can provide desired state-shaping properties that can reduce the usage of high-voltage states, which can reduce wear and disturb effects in the memory 104. These techniques can be performed in the controller 102 or in the memory die 104, When they are performed in the memory die 104, CMOS bonded array (CbA) technology may be used. In CbA technology, a control die, sometimes referred to as CMOS logic, is bonded to a memory die and performs control functions related to data stored on that memory die so that the data stored on that memory die does not have to be passed to the main memory controller die to be manipulated or updated, and then transferred back to the memory die. Using the memory die 104 to perform the mapping can significantly improve the performance of the storage system 100 by reducing the controller-memory die traffic (e.g., in one implementation by ~11% due to transferring 4.5 bits per cell before mapping to 5 bits per cell after mapping).

In one example embodiment, the controller 102 or the memory die 104 maps each vector of input bits into two physical memory cells using a two-dimensional mapping method that has a non-power-of-two number of levels. The map that is used in this example minimizes the amount of logical errors induced by the most-common physical error (i.e., reading an adjacent state to the one that was programmed) and has a relatively-simple implementation that reduces power consumption.

Figure 5:
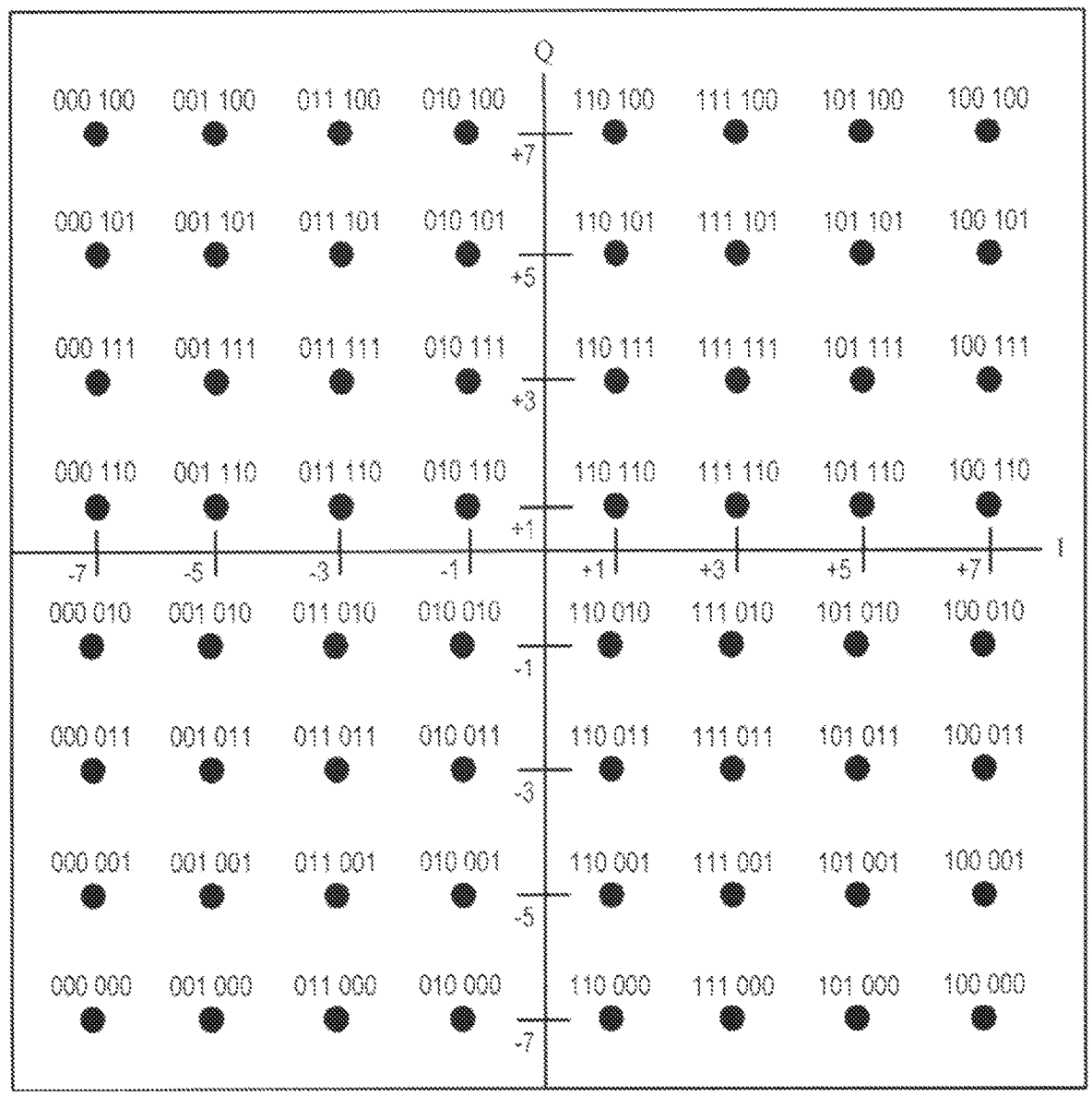
FIG. 5 is a diagram of a quadrature amplitude modulation (QAM) map of an embodiment.

The map used is this example is a modified version of a quadrature amplitude modulation (QAM) map. FIG. 5 is an illustration of a QAM map example, which can be used for mapping a power-of-two number of voltage levels. In one embodiment, the QAM map is modified for use with a non-power-of-two number of states by various reflections and translations of a basic, smaller QAM map.

Figure 6A:
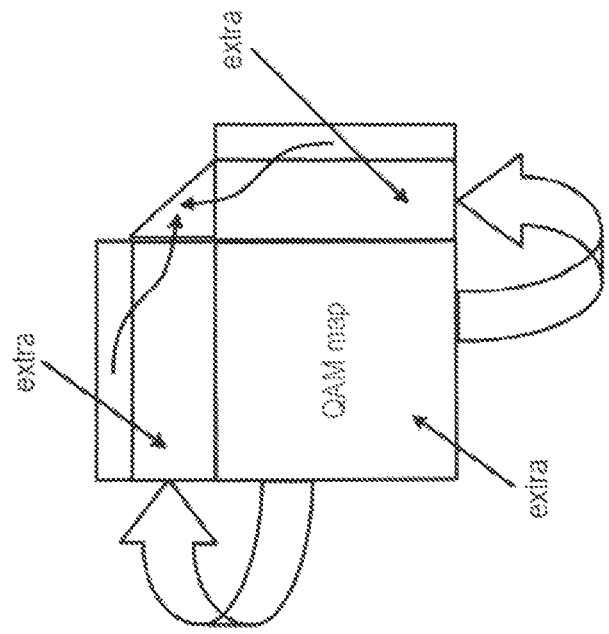
FIGS. 6A and 6B are illustrations of a process of an embodiment for modifying a QAM map for non-power-of-two mapping.
Figure 6B:
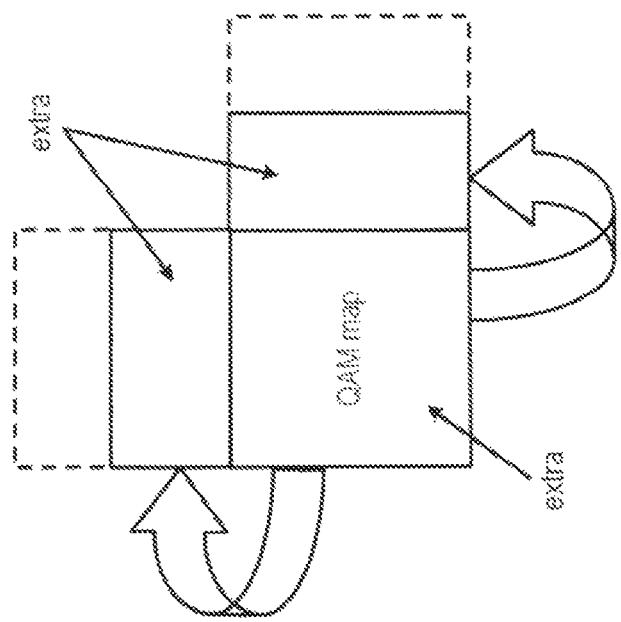
Figure 7:
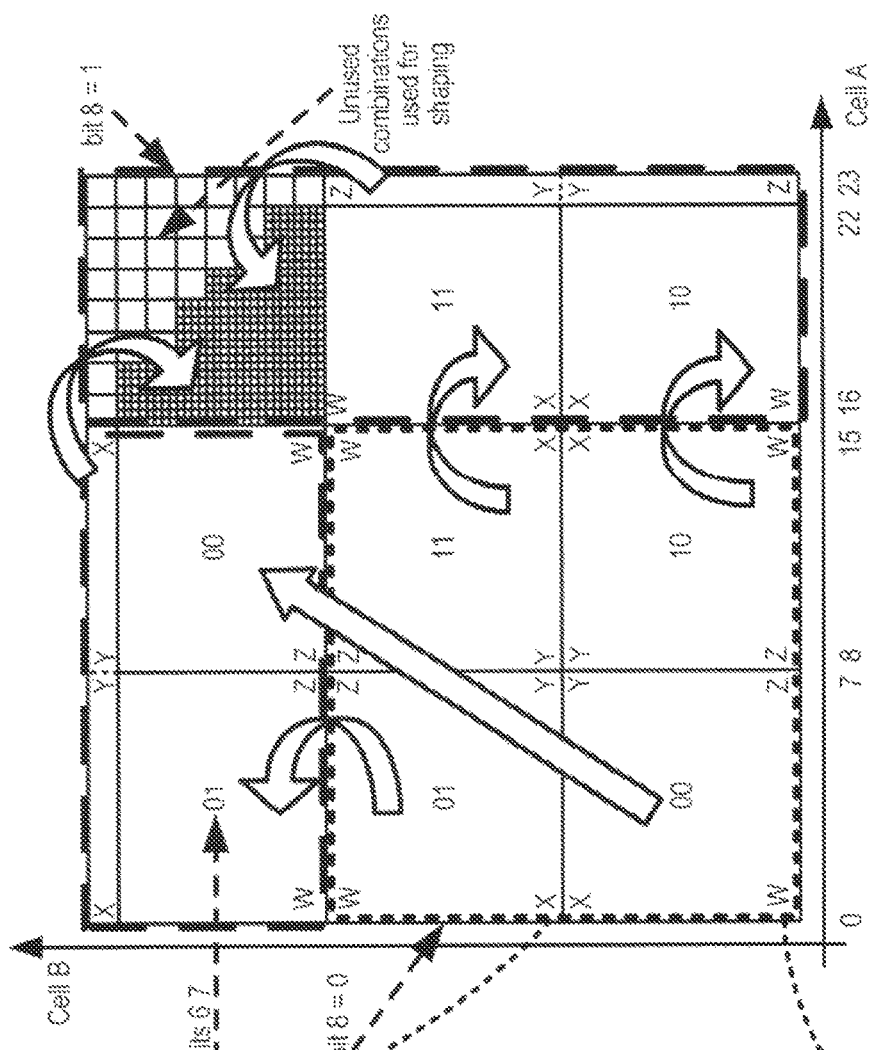
FIG. 7 is a diagram of a modified QAM map of an embodiment for non-power-of-two mapping.

More specifically, as shown in FIGS. 6A and 6B, in one embodiment, a smaller QAM map is modified to reflect half of it on its edge to get a new larger constellation. The outer symbol is then removed and moved to the upper right corner. By building a non-power-of-two mapping by increasing the constellation by reflections and balancing the constellation by folding of the outer symbols, the resulting modified QAM map ensures that physical errors of adjacent symbols result in a single logical (bit) error (e.g., the QAM modulation is a two-dimensional version of Gray code) and also ensures a reduced number of errors when a physical error occurs on the boundary between maps. FIG. 7 shows a 23-by-23 mapping table created by the modification described above. Each symbol represents nine bits, while each cell is programmed to just one of 23 voltage levels. The last row and column from the map, which would require the $24^{th}$ voltage level, are mapped to the unused symbol in the upper right corner. This assignment can be chosen to minimize the logical errors from adjacent-state physical errors.

The assignment of the symbol can also be used for state shaping. That is, the assignment of $2^9=512$ input vectors provides 23×23=529 symbols, which grants some degrees of freedom (529−512=17 symbols are unused) that can be used for state shaping. That is, keeping the unused symbols in the upper-right-most corner avoids the highest-stress voltage levels and achieves a shaping gain by reducing the wear of the memory 104 and by reducing the disturb effects caused by the higher voltage levels. In addition, the ECC decoder can achieve an additional coding gain by taking into account the unused symbols in the mapping scheme for improving the decoding. Further, an alternate high voltage scheme can be beneficial for reducing disturbance effects. For example, the alternate mapping can be used by adjacent cells in a wordline (e.g., even/odd pairs of cells) or for adjacent wordlines (even/odd wordlines). An example of this alternating state shaping is shown in FIGS. 8A and 8B.

Figure 9A:
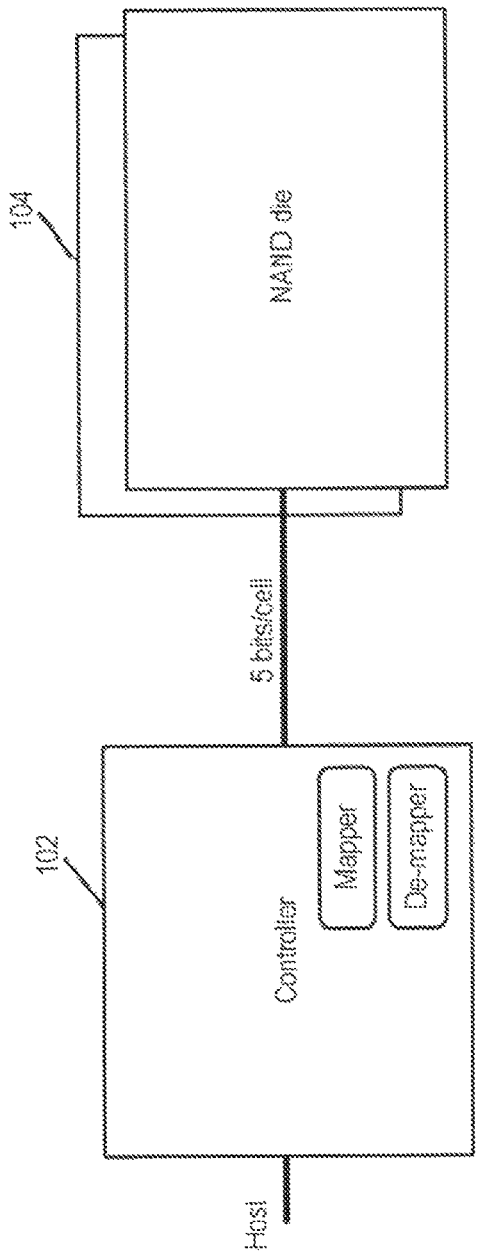
FIG. 9A is a block diagram of an embodiment in which a mapper and de-mapper are located in a controller of a storage system.
Figure 9B:
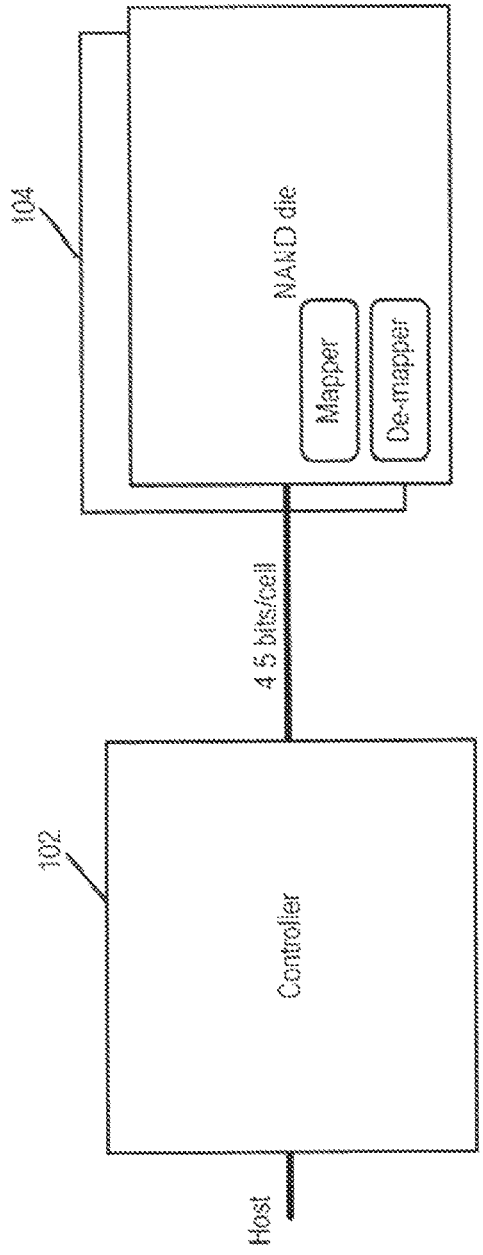
FIG. 9B is a block diagram of an embodiment in which a mapper and de-mapper are located in a memory die of a storage system.

As noted above, the mapping/de-mapping operations can be performed in the controller 102 (see FIG. 9A) or the memory die 104 (see FIG. 9B). When implemented in the controller 104, five bits/cell can be sent to the memory die 104 to describe the voltage level of each cell. However, when implemented in the memory die 104, the controller 102 may only need to send the user data (and ECC parity), which, in the above example, is just 4.5 bits/cell. This amounts to 10% less traffic on the memory bus, which is significant both for performance and power reduction. When implemented in the memory die 104, CbA technology can be used.

There are several advantages associated with these embodiments. For example, compared to X4 implementations, these embodiments allow for increased logical scaling, which can be important as it can allow for a significant cost reduction. Also, if current NAND technology only allows for between 4 and 5 information bits/cell, going to an X5 implementation with five physical bits/cell is wasteful. 32 voltage levels will significantly degrade the programming speed, is much more susceptible to disturb effects, and considerably increases the traffic to the memory die 104. Also, as noted above, with the mapper/de-mapper in the memory die 104, only 4.5 bits/cell are transferred instead of 5 bits/cell, which reduces the traffic by ~10% with its associated impact on performance and power consumption. Further, as NAND technology density continues to scale, adding logical scaling can be extremely important.

Finally, as mentioned above, any suitable type of memory can be used. Semiconductor memory devices include volatile memory devices, such as dynamic random access memory ("DRAM") or static random access memory ("SRAM") devices, non-volatile memory devices, such as ReRAM, electrically erasable programmable read only memory ("EEPROM"), flash memory (which can also be considered a subset of EEPROM), ferroelectric random access memory ("FRAM"), and MRAM, and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steeling element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional (2D) memory structure or a three dimensional (3D) memory structure.

In a 2D memory structure, the semiconductor memory elements are arranged in a single plane or a single memory device level. Typically, in a 2D memory structure, memory elements are arranged in a plane (e.g., in an x-z direction plane) that extends substantially parallel to a major surface of a substrate that supports the memory elements. The substrate may be a wafer over or in which the layer of the memory elements is formed or it may be a carrier substrate that is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A 3D memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements in each column. The columns may be arranged in a 2D configuration, e.g., in an x-z plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the 2D and 3D structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, which are intended to define the scope of the claimed invention. Finally, it should be noted that any aspect of any of the embodiments described herein can be used alone or in combination with one another.

What is claimed is:

1. A storage system for multi-cell mapping comprising:
   a memory die comprising a plurality of memory cells, each memory cell configured to store a non-power-of-two number of states of voltage levels; and
   a controller configured to provide data to the memory die for storage;
   wherein the memory die is configured to:
      map the data to the plurality of memory cells with a non-power-of-two number of voltage levels using a modified quadrature amplitude modulation (QAM) map; and
      write the data into the plurality of memory cells as determined by the modified QAM map,
   wherein the modified QAM map is created by:
      reflecting a right and left half of a basic QAM map smaller than the modified QAM map on a right and an upper edge of the basic QAM map, respectively, and
      moving a symbol in a right end of a portion reflected on the right edge and a symbol in an upper end of a portion reflected on the upper edge to an upper right of the basic QAM map.

2. The storage system of claim 1, wherein the data is written into adjacent memory cells.

3. The storage system of claim 1, further comprising performing state shaping to the modified QAM map.

4. The storage system of claim 1, wherein the mapping is performed by a control die bonded to the memory die.

5. The storage system of claim 1, wherein the non-power-of-two number is 23.

6. The storage system of claim 1, wherein the memory die comprises a three-dimensional memory.

7. In a storage system with a memory die comprising a plurality of memory cells, each memory cell configured to store a non-power-of-two number of states of voltage levels, a method comprising:
   mapping to the plurality of memory cells with a non-power-of-two number of voltage levels using a modified quadrature amplitude modulation (QAM) map; and
   writing the data into the plurality of memory cells as determined by the modified QAM map,
   wherein the modified QAM map is created by:
      reflecting a right and left half of a basic QAM map smaller than the modified QAM map on a right and an upper edge of the basic QAM map, respectively, and
      moving a symbol in a right end of a portion reflected on the right edge and a symbol in an upper end of a portion reflected on the upper edge to an upper right of the basic QAM map.

8. The method of claim 7, wherein the data is written into adjacent memory cells.

9. The method of claim 7, further comprising performing state shaping to the modified QAM map.

10. The method of claim 7, wherein the mapping is performed by one of the following: a controller of the storage system, the memory die, or a control die bonded to the memory die.

11. The method of claim 7, further comprising performing a de-mapping operation.

12. The method of claim 11, wherein the de-mapping operation is performed by one of the following: a controller of the storage system, the memory die, or a control die bonded to the memory die.

13. The method of claim 7, wherein the non-power-of-two number is 23.

14. A storage system comprising:
a memory die comprising a plurality of memory cells, each memory cell configured to store a non-power-of-two number of states of voltage levels;
means for mapping to the plurality of memory cells with a non-power-of-two number of voltage levels using a modified quadrature amplitude modulation (QAM) map; and
means for writing the data into the plurality of memory cells as determined by the modified QAM map,
wherein the modified QAM map is created by:
  reflecting a right and left half of a basic QAM map smaller than the modified QAM map on a right and an upper edge of the basic QAM map, respectively, and
  moving a symbol in a right end of a portion reflected on the right edge and a symbol in an upper end of a portion reflected on the upper edge to an upper right of the basic QAM map.

\* \* \* \* \*